United States Patent

Voorman et al.

[11] Patent Number: 6,137,647
[45] Date of Patent: Oct. 24, 2000

[54] AUTOMATIC GAIN CONTROL CIRCUIT FOR USE IN DETECTING SERVO PULSES FOR CONTROLLING THE POSITION OF A READ HEAD IN A HARD DISK DRIVE

[75] Inventors: Johannes O. Voorman; Joao N. V. L. Ramalho, both of Eindhoven, Netherlands

[73] Assignee: U.S. Philips Corporation, New York, N.Y.

[21] Appl. No.: 09/075,679

[22] Filed: May 11, 1998

[30] Foreign Application Priority Data

Jun. 3, 1997 [EP]  European Pat. Off. .............. 97201659

[51] Int. Cl.$^7$ ................................. G11B 5/02; G11B 5/09
[52] U.S. Cl. ................................. 360/67; 360/46
[58] Field of Search ................................. 360/46, 65, 67; 375/340, 345; 330/281

[56] References Cited

U.S. PATENT DOCUMENTS 4,602,381  7/1986  Cugnini et al. ............................ 381/13

Primary Examiner—W. Chris Kim
Attorney, Agent, or Firm—Edward W. Goodman

[57] ABSTRACT

An automatic gain control circuit, for amplifying an input signal so that it has a specific correspondence with a reference value ($V_{ref}$), includes an input terminal (2) for receiving the input signal, a variable gain amplifier (4) for amplifying the input signal in response to a gain control signal, a peak detector (14) for detecting peaks in the amplified input signal, the peak detector (14) having an attack time constant ($T_a$) and a decay time constant ($T_d$), and supplying a peak detector output signal ($V_p$) representative of the amplitude of the peaks in the amplified input signal, a comparator (20) for comparing the peak detector output signal ($V_p$) with the reference value ($V_{ref}$) to form an error signal (e), and an integrator (30) for integrating the error signal (e) to form the gain control signal. The peak detector includes a controller for controlling the decay time constant in response to the error signal, the controller decreasing the decay time constant for increasing error signals, in a situation when the peak detector output signal ($V_p$) is larger than the reference value ($V_{ref}$). The relationship, $T_d = c \cdot T_a^p$, is maintained between the attack time constant $T_a$ and the decay time constant $T_d$ of the peak detector, where c is a positive constant and p is a constant larger than 1. p is preferably equal to 2 and c satisfies the relation $20 \leq c \leq 200$.

9 Claims, 2 Drawing Sheets

AUTOMATIC GAIN CONTROL CIRCUIT FOR USE IN DETECTING SERVO PULSES FOR CONTROLLING THE POSITION OF A READ HEAD IN A HARD DISK DRIVE

BACKGROUND OF THE INVENTION

1. Field of The Invention

The invention relates to an automatic gain control circuit for amplifying an input signal so that it has a specific correspondence with a reference value, the circuit comprising input means for receiving the input signal; variable gain amplifier means for amplifying said input signal in response to a gain control signal; peak detector means for detecting peaks in said amplified input signal, the peak detector means having an attack time constant and a decay time constant, so as to supply a peak detector output signal which is representative of the amplitude of the peaks in said amplified input signal; comparator means for comparing the peak detector output signal with said reference value so as to derive an error signal therefrom; and integrator means for integrating the error signal so as to form said gain control signal.

The invention also relates to a hard disk drive apparatus provided with the automatic gain control circuit.

2. Description of The Related Art

An automatic gain control circuit as defined in the opening paragraph is well known in the art and can, as an example, be used in a servo demodulator circuit in a hard disk drive.

SUMMARY OF THE INVENTION

The invention aims at providing an improved automatic gain control circuit. In accordance with the invention, the automatic gain control circuit is characterized in that the peak detector means comprising means for controlling said decay time constant in response to said error signal, and that, at least in a situation when the peak detector output signal is larger than said reference signal, said means for controlling said decay time constant decreases said decay time constant for increasing error signals, and that, at least in said situation when the peak detector output signal is larger than said reference value, the following relationship is maintained between the attack time constant $T_a$ and the decay time constant $T_d$ of the peak detector means:

$$T_d = c \cdot T_a^p,$$

where c is a positive constant and p is a constant larger than 1.

The invention is based on the recognition that a hard disk comprises a plurality of servo patterns prerecorded on the hard disk. A servo pattern comprises a burst of, e.g., 40 dibits for AGC control, followed by a timing reference portion which is, e.g., 8 dibits long and which comprises a timing mark, a Gray code which is, e.g., 13 dibits long and subsequently followed by a plurality of servo bursts, each burst being comprised of a number of dibits. In the AGC circuit in accordance with the invention, one or more peak detectors are used to detect the amplitudes of the peaks present in the input signal. When starting reproduction, the HDD is first switched into a search mode in which the timing marks should be detected. When in lock, the detection system has a timing window for gating the servo patterns positioned on the hard disk. In the search mode, however, the timing window is not yet enabled, so that the AGC circuit 'sees' all kinds of signals, such as not only the servo patterns, but also the actual data recorded on the hard disk. Known AGC circuits are unable, in this situation, to detect, as an example, the timing mark in the first servo pattern read from the hard disk. One of the measures to improve the behavior of the AGC circuit, is the use of the claimed relationship between the attack and the decay times of the peak detector. This results in an optimal behavior of the peak detector, as the peak detector climbs directly to the peaks in the input signal.

Suppose that the attack time constant is larger than the optimal attack time constant that satisfies the above relationship, the peak detector cannot climb to the peaks of the input signal. When the attack time constant is smaller than the optimal time constant, convergence is correct, but the operation is noisier than needed.

The parameter p in the above equation is a constant which is substantially equal to 2. For the constant c, it can be said that the value of the constant c depends on the shape of the pulses that occur in the input signal to the peak detector. For purely sinusoidal pulses at the input of the peak detector, the value of c is substantially equal to 20 or a little higher. For more Lorentzian type pulses at the input of the peak detector, c is much higher. Generally, it can be said that the following relationship holds for the constant c:

$$20 \leq c \leq 200.$$

It should be noted in this respect that, for the value range of the parameter c, as given above, the attack and decay time constants should be expressed in numbers of dibits, or, said in a different way, in numbers of periods of the servo frequency of the signal in the servo bursts. In this situation, the attack and decay time constants are dimensionless parameters, and so is the parameter c. It speaks for itself that the attack and decay time constants could have been expressed in 'seconds'. In that situation, c has a different value range than given above, and is expressed in the dimension of 1/second.

This automatic gain control circuit may be further characterized in that in said other situation, the means for controlling said attack time constant decreases said attack time constant for increasing error signals.

In the search mode, as the time window for windowing the servo patterns is disabled, detection of the timing mark may be not well possible. This due to the fact that the AGC control function will be fully active. By maintaining its gain value, obtained from the dibits in the AGC control area, at substantially the same value there-after, the detection of the sector timing mark is made possible.

It should be noted that the locking of the AGC to the dibits in the AGC control area is considered to be the first-mentioned situation, and the situation where the gain value should be maintained at substantially the same value, e.g., during a drop out, is considered to be the other situation.

BRIEF DESCRIPTION OF THE DRAWINGS

These and other aspects of the invention will be apparent from and elucidated with respect to the embodiments described hereafter in the figure description, in which.

DESCRIPTION OF THE PREFERRED EMBODIMENTS

Figure 1:
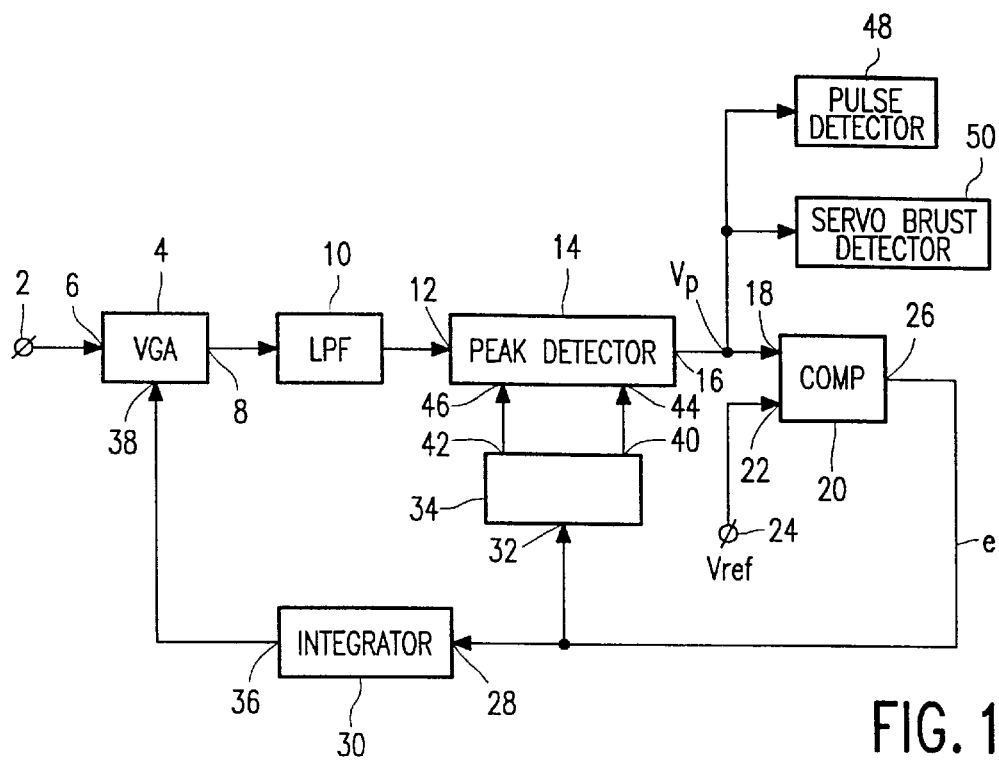
FIG. 1 shows an embodiment of the automatic gain control circuit.

FIG. 1 shows an embodiment of the automatic gain control circuit, which is provided with an input terminal 2, for receiving an input signal. This input signal can be the signal read from a hard disk. The input terminal 2 is coupled to an input 6 of a variable gain amplifier 4. An output 8 of the amplifier 4 is coupled, via a low-pass filter 10, which may be included in the amplifier 4, to an input 12 of a peak detector unit 14. An output of the peak detector unit 14 is coupled to a first input 18 of a comparator unit 20, which has a second input 22 coupled to a terminal 24 at which a reference value $V_{ref}$ is available for supply to the input 22. An output 26 of the comparator unit 20 is coupled to an input 28 of an integrator unit 30. An output 36 of the integrator unit 30 is coupled to a control signal input 38 of the variable gain amplifier 4.

The variable gain amplifier 4 amplifies the signal applied to its input 6, in response to the gain control signal applied to its control signal input 38, and supplies an amplified signal to its output 8. The peak detector unit 14 detects peaks in said amplified signal, and supplies an output signal $V_p$ at its output which has a relationship with the amplitude of the peaks in said amplified signal. In a preferred embodiment of the peak detector unit 14, the peak detector unit 14 comprises two peak detectors, one peak detector for detecting the peaks of positive polarity and the other peak detector for detecting the peaks of negative polarity. The two peak amplitude values obtained are added together so as to form an output signal which is representative of the peak-to-peak value of the signal applied to the input of the peak detector unit 14. This detection is less insensitive to the influences of baseline wander in the signal.

The comparator unit 20 compares the peak detector output signal $V_p$ with said reference value $V_{zef}$ so as to derive an error signal e therefrom. More specifically, the comparator unit 20, subtracts $V_{ref}$ from $V_p$ so as to form the error signal e. The error signal e is integrated in the integrator unit 30. Thus results in a control signal applied to the control signal input 38, so as to control the gain the variable gain amplifier 4. The gain in the amplifier 4 is controlled in such a way that the error signal e is controlled towards a small value (zero).

The peak detector unit 14 has an attack time constant $T_a$ and a decay time constant $T_d$. The attack time constant $T_a$ governs the behavior of the peak detector unit 14, when a sudden rise in the amplitude of the input signal occurs, and the decay time constant $T_d$ governs the behavior of the peak detector unit 14, when a sudden decrease in the amplitude of the input signal occurs.

In order to optimally detect the peaks in the peak detector unit 14, a relationship exists between the attack time constant $T_a$ and the decay time constant $T_d$, which relationship will be explained hereafter.

Figure 2:
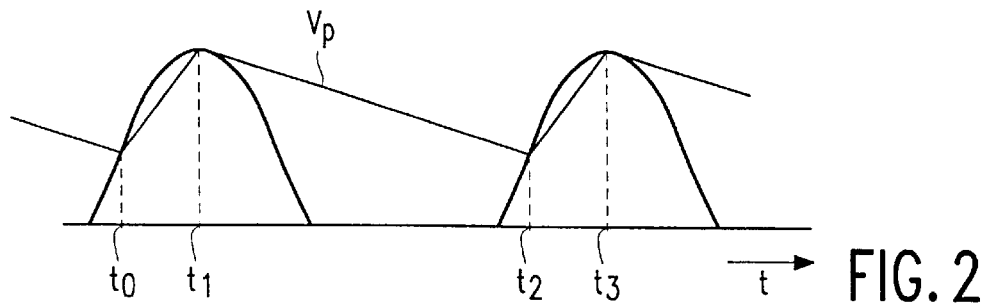
FIG. 2 shows a half-wave-rectified sinusoid and the output signal of the peak detector unit in the circuit of FIG. 1.

FIG. 2 shows a half-wave-rectified sinusoid, as a function of time, that is supplied as input signal to the peak detector unit 14. This half-wave-rectified sinusoid could be obtained from a sequence of subsequent dibits to be described later that are present in the AGC portion $P_1$ or in the servo burst portion $P_4$, see FIG. 3. FIG. 2 further shows the output signal $V_p$ of the peak detector unit 14, as a function of time. The peak detector unit 14 attacks, during the time intervals between the time instants $t_0$ and $t_1$ and between the time instants $t_2$ and $t_3$, and decays during the time intervals before the time instant $t_0$, between the time instants $t_1$ and $t_2$ and after the time instant $t_3$. For an optimal peak detection, the behavior of the peak detector unit 14 is such that, each time, the peak detector unit 14 attacks towards precisely the maxima in the half-wave-rectified sinusoid.

A calculation reveals that this requirement leads to the following relationship between $T_a$ and $T_d$:

$$T_d = c \cdot T_a^p,$$

where c is a positive constant and p is a constant larger than 1.

More specifically, p is a constant substantially equal to 2. For the constant c, the following relationship holds:

$$20 \leq c \leq 200.$$

For the example of the half wave rectified sinusoid, it appears that c has a value smaller than 50. In more realistic situations, and e.g., dependent of the filter characteristic of the low-pass filter 10, the input signal to the peak detector unit 14 is not ideally sinusoidal. In such situations, c will have a much larger value, between 50 and 200.

It should be noted here, that the attack time constant of the peak detector unit 14 is defined as the time interval, starting at the time instant when a positive-going step-shaped input signal from a zero amplitude towards a specific step amplitude is applied to the input of the peak detector unit 14, until the time instant when the output signal of the peak detector reaches the specific step amplitude. Further, the decay time constant of the peak detector unit 14 is defined as the time interval, starting at the time instant when a down-going step-shaped input signal from a specific step amplitude towards a zero amplitude is applied to the input of the peak detector unit 14, until the time instant when the output signal of the peak detector reaches the zero amplitude.

In an embodiment of the automatic gain control circuit, where the attack and the decay time constants are fixed, these constants should thus satisfy the above relationship in order to function optimally.

In this respect, it should be noted that the relationship between the attack time constant and the decay time constant of the peak detector unit is non-linear for the attack time, more specifically, quadratic for p=2. In the latter case, this means that if the attack time constant and the decay time constant are expressed in 'seconds', c has the dimension of 1/second. The value range for c given above is not valid in this situation.

One could express the attack time constant and the decay time constant in a dimensionless way, namely, by expressing the attack time and the decay time in number of periods of the servo frequency, or in number of dibits, to be explained hereafter. The period of the servo frequency is, in fact, equal to 1/(t3−t1), which equals the length of a dibit, see FIG. 2. In the dimensionless expression for the attack time constant and the decay time constant, the constant c is dimensionless as well, and satisfies the value range given above.

In a further elaboration of the embodiment described thus far, the attack and decay time constants are controllable in their value. To that purpose, the circuit further comprises a control signal generator unit 34 which has an input 32 coupled to the output 26 of the comparator unit 20 and which has two outputs 40 and 42 coupled to control signal inputs 44 and 46, respectively, of the peak detector unit 14.

More specifically, one of the two time constants is controlled in response to the error signal e, and the other one of the two time constants is derived from the first one, using the relationship described above. The control signal generator unit 34 thus generates a first control signal from the error signal e, which is supplied via its output 42 to the control signal input 46 of the peak detector unit 14, and which is meant to control one of the time constants, let us assume the decay time constant, and generates a second control signal, either from the error signal, or from the first control signal, which second control signal is supplied via its output 40 to the control signal input 44 of the peak detector unit 14, so as to control the other one of the time constants, that is, the attack time constant, such that the above relationship between both time constants is maintained.

The use of the automatic gain control circuit in accordance with the invention will now further be described in an application where the circuit is used in a demodulator circuit for demodulating the servo patterns prerecorded on a hard disk.

Figure 3:
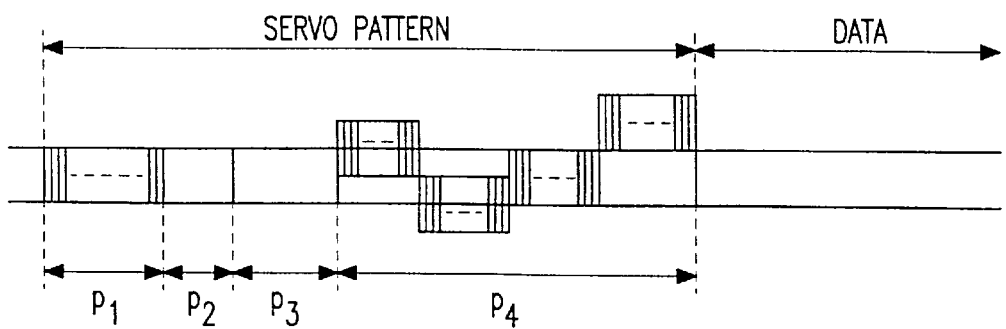
FIG. 3 a servo pattern, as present in a track on a hard disk.

FIG. 3 shows, schematically, the contents of a servo pattern. The servo pattern in a track on the hard disk comprises an AGC portion, denoted $P_1$, used for setting the time constants in the automatic gain control circuit, a timing reference portion $P_2$, for bringing a data detection circuit (not shown) in correct timing relationship with the information read from the track, a Gray code portion $P_3$, which identifies the tracks by an increasing number, when going from the center towards the edge of the disk, and a servo burst portion $P_4$, which is used for enabling a track servo control, so as to correctly position a read head on the track in a direction transverse to the track. The AGC portion $P_1$ comprises a burst of a plurality of, e.g., 40 dibits. The timing reference portion $P_2$ comprises is, e.g., 8 dibits long, but comprise a timing mark comprised of one or more dibits. The Gray code portion $P_3$ is, e.g., 13 dibits long, and the servo burst portion $P_4$ comprises a plurality of servo bursts of a number of, e.g., 11 dibits each.

First, the functioning of the control signal generator unit 34 will be described in a situation when the error signal e ($e=V_p-V_{ref}$) is positive. In this situation, the control signal generator unit 34 generates control signals to control the attack time $T_a$ constant and the decay time constant $T_d$, such that with increasing error signal amplitude, both time constants are decreased, while the above defined relationship between both time constants is maintained. Decreasing the attack and decay time constants in the peak detector 14 can be realized by increasing the attack current and the decay current in the peak detector for charging and discharging, respectively, of an internal capacitor (not shown) in the peak detector 14.

Second, the functioning of the control signal generator unit 34 will be described in a situation when the error signal e ($e=V_p-V_{ref}$) is negative. Such situation takes place when a drop out occurs, or in the portion $P_2$ of the servo pattern, when no dibits are present. In this situation, the control signal generator unit 34 generates control signals to control the attack time $T_a$ constant and the decay time constant $T_d$, such that, with increasing(ly negative) error signal amplitude, the attack time constant is decreased, while the decay time constant remains constant. As a result, when (as an example) the timing reference dibit(s) arrive(s), it(they) can be properly amplified and can thus be detected. This behavior further can improve the detection of the Gray code.

For obtaining the correct timing, the timing marks in the time mark region $P_2$ can be detected in a pulse detection unit 48, shown, schematically, in FIG. 1. The pulse detection unit 48 will further be used to detect the Gray code pulses.

The detection of the amplitudes of the servo bursts can be realized by a servo burst detector unit 50, also shown, schematically, in FIG. 1. The amplitudes of the various bursts in the portion $P_4$ are an indication of how far the read head (not shown) is positioned off track. When the head is mispositioned, this head position can be corrected, accordingly.

In order for the automatic gain control circuit to function properly, it should be noted that a further requirement exists between the time constant of the automatic gain control circuit, which time constant is defined as the time constant of the circuit, assuming that the peak detector unit 14 has no delay (that means a time constant equal to zero), and the time constant of the peak detector 14. This further requirement is that the time constant of the automatic gain control circuit is substantially equal to the decay time constant of the peak detector 14.

Figure 4:
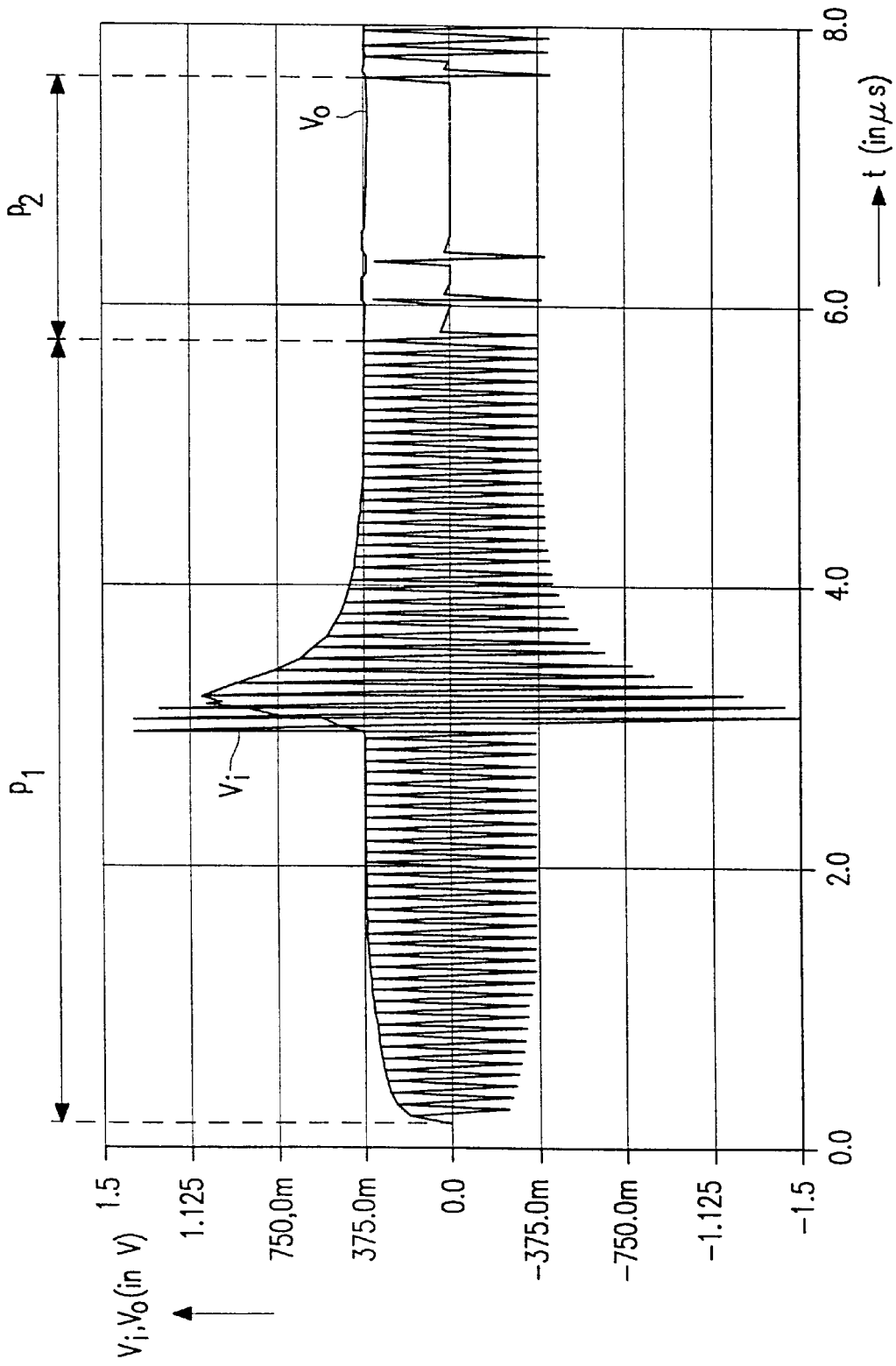
FIG. 4 shows the input and output signals of a peak detector in the peak detector unit in the automatic gain control circuit.

FIG. 4 shows an example of the input signal $V_i$ and the output signal $V_o$, as a function of time, of the peak detector in the peak detector unit 14 that detects the positive peaks in the input signal, when the AGC circuit is in the search mode. More precisely, FIG. 4 shows the portions $P_1$ and $P_2$ of the servo pattern read from the hard disk. What can be seen in FIG. 4, is that a disturbance is present in the AGC portion, and that the attack time constant of the peak detector is controlled such that the output signal climbs relatively fast to the peaks in the AGC portion. Further, the decay time constant of the peak detector is controlled such that upon decreasing peak amplitudes, the peak detector can easily follow the peaks. Further, in the portion $P_2$, the decay time constant is increased so that the output signal of the peak detector remains at a substantially constant level, so that the timing pulses, as well as the following Gray code pulses can be detected correctly.

While the invention has been described with reference to preferred embodiments thereof, it is to be understood that these are not limitative examples. Thus, various modifications may become apparent to those skilled in the art, without departing from the scope of the invention, as defined by the claims. It should thus be noted that, although the invention has been described with reference to an automatic gain control circuit for a hard disk drive, the automatic gain control circuit could be used in other reproduction systems, such as other magnetic recording systems.

Further, the invention lies in each and every novel feature or combination of features.

What is claimed is:

1. An automatic gain control circuit for amplifying an input signal so that said amplified input signal has a specific correspondence with a reference value, the circuit comprising:

input means for receiving the input signal;

variable gain amplifier means for amplifying said input signal in response to a gain control signal;

peak detector means for detecting peaks in said amplified input signal, the peak detector means having an attack time constant and a decay time constant, said peak detector means supplying a peak detector output signal representative of the amplitude of the peaks in said amplified input signal;

comparator means for comparing the peak detector output signal with said reference value so as to derive an error signal; and integrator means for integrating the error signal so as to form said gain control signal, characterized in that the peak detector means comprises means for controlling said decay time constant in response to said error signal, and that, at least in a situation when the peak detector output signal is larger than said reference signal, said means for controlling said decay time constant decreases said decay time constant for increasing error signals, and that, at least in said situation when the peak detector output signal is larger than said reference value, the following relationship is maintained between the attack time constant $T_a$ and the decay time constant $T_d$ of the peak detector means:

$$T_d = c \cdot T_a^p,$$

where c is a positive constant and p is a constant larger than 1.

2. The automatic gain control circuit as claimed in claim 1, characterized in that p is a constant substantially equal to 2.

3. The automatic gain control circuit as claimed in claim 1, characterized in that the following relationship holds for said constant c:

$$20 \leq c \leq 200.$$

4. The automatic gain control circuit as claimed in claim 1, characterized in the peak detector means comprises means for controlling said attack time constant, said means for controlling said attack time constant deriving said attack time constant from said decay time constant using said relationship.

5. The automatic gain control circuit as claimed in claim 1, characterized in that, in another situation when the peak detector output signal is smaller than said reference signal, the means for controlling said decay time constant maintains said decay time constant at a substantially constant value.

6. The automatic gain control circuit as claimed in claim 5, characterized in that, in said other situation, the means for controlling said attack time constant decreases said attack time constant for increasing error signals.

7. The automatic gain control circuit as claimed in claim 1, characterized in that said peak detector means comprises first and second peak detectors for detecting peaks of positive and negative polarity, respectively, the peak detector means generating a peak detector output signal having a relationship with the peak-to-peak amplitude in said amplified input signal.

8. A hard disk drive apparatus for reading information from a hard disk, the apparatus comprising:

a hard disk;

drive means for driving said hard disk;

read means for reading information, in the form of an input signal, from said hard disk; and an automatic gain control circuit for amplifying said input signal so that said amplified input signal has a specific correspondence with a reference value, said automatic gain control circuit being used to aid in detecting Gray code pulses in a servo pulse portion of the input signal, and to correct a position of the read means using servo pulse bursts in said servo pulse portion, the automatic gain control circuit comprising:

input means for receiving the input signal;

variable gain amplifier means for amplifying said input signal in response to a gain control signal;

peak detector means for detecting peaks in said amplified input signal, the peak detector means having an attack time constant and a decay time constant, said peak detector means supplying a peak detector output signal representative of the amplitude of the peaks in said amplified input signal;

comparator means for comparing the peak detector output signal with said reference value so as to derive an error signal; and integrator means for integrating the error signal so as to form said gain control signal, characterized in that the peak detector means comprises means for controlling said decay time constant in response to said error signal, and that, at least in a situation when the peak detector output signal is larger than said reference signal, said means for controlling said decay time constant decreases said decay time constant for increasing error signals, and that, at least in said situation when the peak detector output signal is larger than said reference value, the following relationship is maintained between the attack time constant $T_a$ and the decay time constant $T_d$ of the peak detector means:

$$T_d = c \cdot T_a^p,$$

where c is a positive constant and p is a constant larger than 1.

9. The hard disk drive apparatus as claimed in claim 8, characterized in that said apparatus further comprises servo demodulator means for generating a correction signal for correcting the position of the read means, said servo demodulator means detecting timing pulses and the servo bursts included in servo patterns accommodated on the hard disk, said servo demodulator means being coupled to receive said peak detector output signal.

* * * * *